United States Patent [19]
Wong et al.

[11] Patent Number: 5,111,067
[45] Date of Patent: May 5, 1992

[54] POWER UP RESET CIRCUIT

[75] Inventors: Keng L. Wong; Joseph D. Schutz, both of Portland, Oreg.

[73] Assignee: Intel Corporation, Santa Clara, Calif.

[21] Appl. No.: 692,487

[22] Filed: Apr. 29, 1991

[51] Int. Cl.[5] .................... H03K 17/20; H03K 17/22; H03K 17/24; H03K 17/06
[52] U.S. Cl. ................. 307/272.3; 307/594; 307/597; 307/603; 307/296.5
[58] Field of Search .............. 307/272.3, 592, 594, 307/597, 603, 296.5, 279

[56] References Cited

U.S. PATENT DOCUMENTS

| | | | |
|---|---|---|---|
| 4,045,692 | 8/1977 | Morokawa et al. | 307/272.3 |
| 4,103,187 | 7/1978 | Imamura | 307/272.3 X |
| 4,140,930 | 2/1979 | Tanaka | 307/272.3 X |
| 4,558,233 | 12/1985 | Nakamori | 307/594 X |
| 4,594,518 | 6/1986 | Pollachek | 307/272.3 X |
| 4,607,178 | 8/1986 | Sugie et al. | 307/272.3 X |
| 4,686,383 | 8/1987 | Croft | 307/272.3 |
| 4,788,454 | 11/1988 | Tanagawa et al. | 307/272.3 |

*Primary Examiner*—Edward P. Westin
*Assistant Examiner*—David R. Bertelson
*Attorney, Agent, or Firm*—Blakely, Sokoloff, Taylor & Zafman

[57] ABSTRACT

A global reset circuit especially suitable for integration into a microprocessor and implemented in CMOS technology is disclosed herein. This circuit includes reset circuitry having an input adapted for connection with a direct current power supply voltage which, when activated, rises from its minimum voltage level to its maximum voltage level over a period of time, and an output adapted for connection with at least one circuit component to be reset, for example certain components forming part of a microprocessor. To this end, the circuitry provides a reset signal at its output upon initiation of the power supply voltage and until the power supply voltage reaches a predetermined level, at which time the reset signal is removed. A latching circuit which forms part of the reset circuitry is operated by the power supply voltage in a first state during the presence of the reset signal and in a second, latched state for removing the reset signal. The latching circuit operates in its second, latched state so long as the supply voltage remains above the predetermined level. Means also forming part of the reset circuitry is provided for grounding the latching circuit through a predetermined resistance.

9 Claims, 2 Drawing Sheets

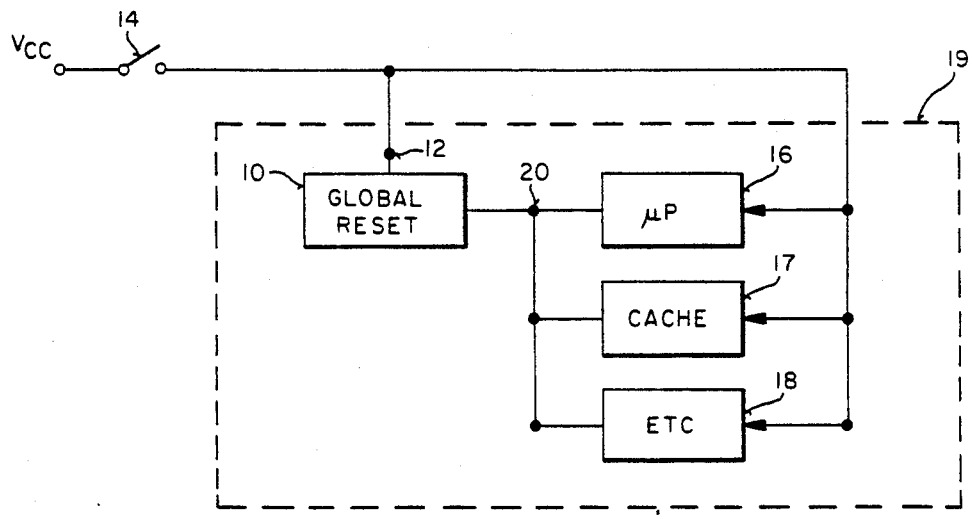
FIG_1
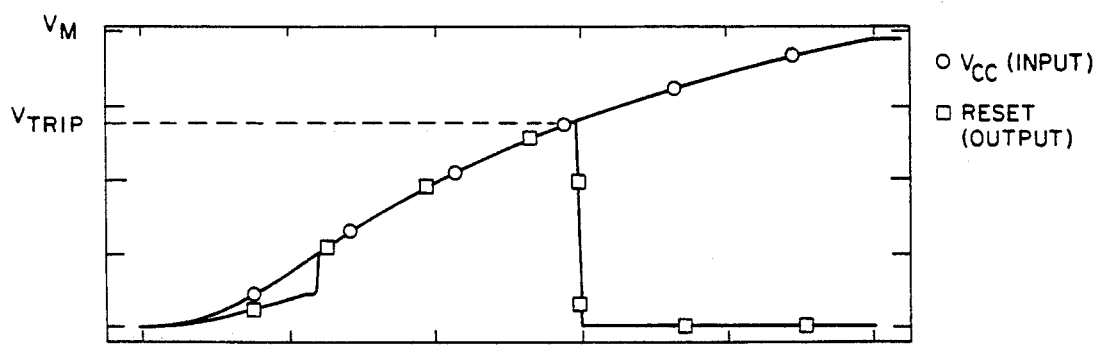
FIG_2A INPUT/OUTPUT WAVEFORMS
○ V_CC (INPUT)
□ RESET (OUTPUT)
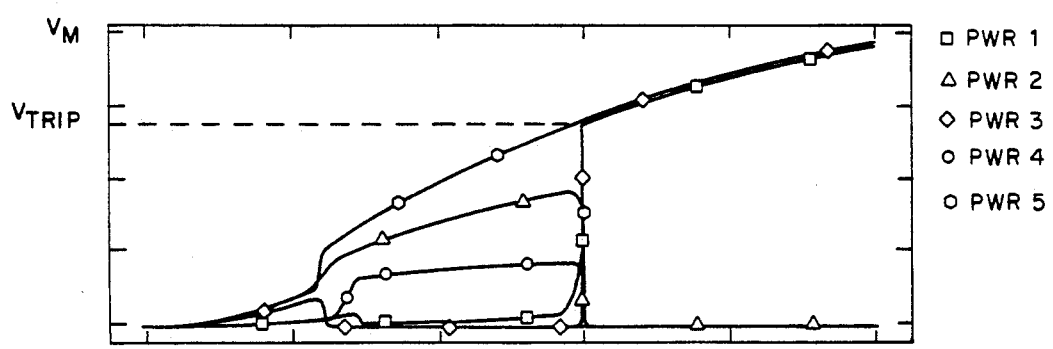
FIG_2B INTERNAL WAVEFORMS
□ PWR 1
△ PWR 2
◇ PWR 3
○ PWR 4
○ PWR 5

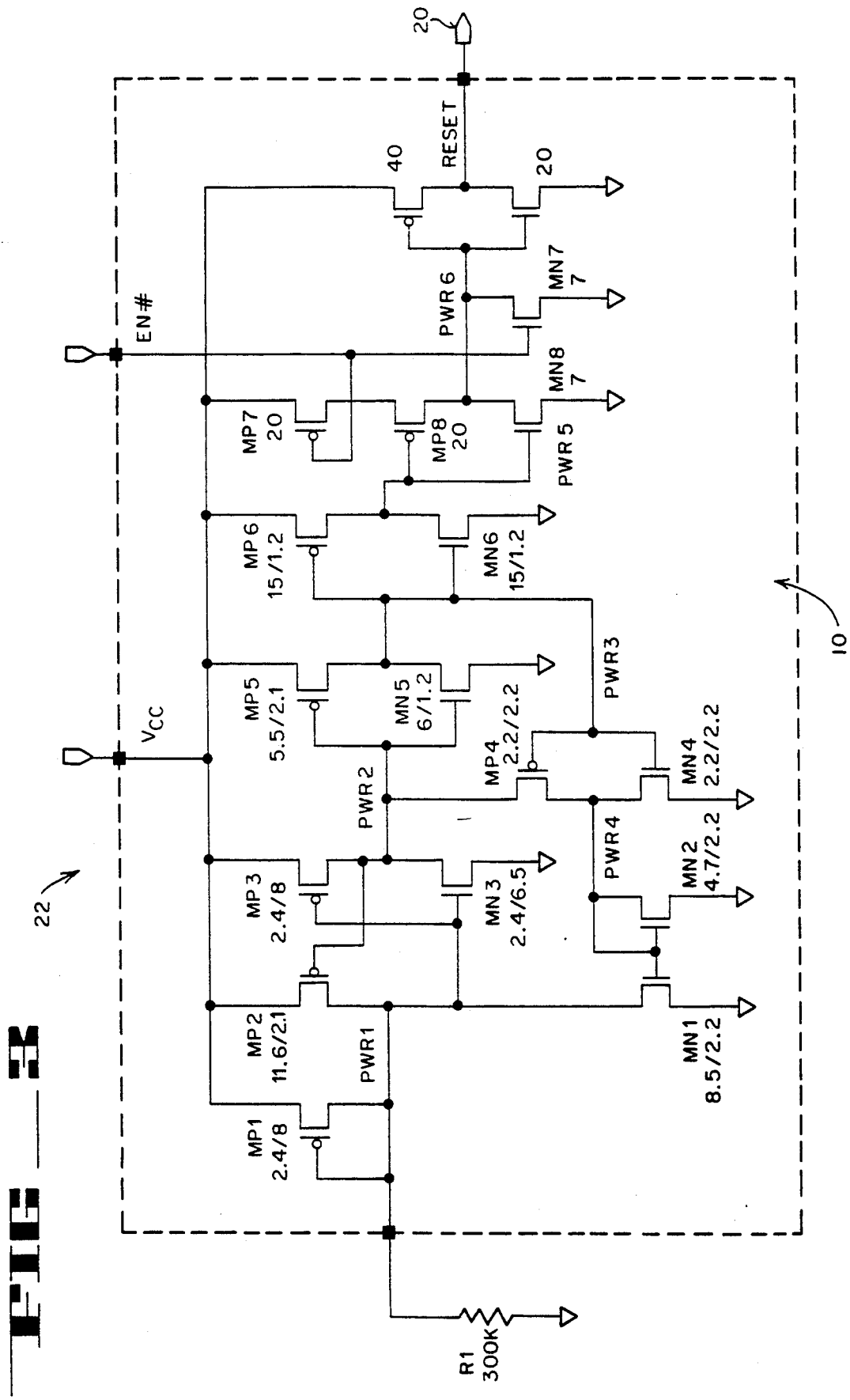

POWER UP RESET CIRCUIT

FIELD OF THE INVENTION

The present invention relates generally to reset circuits, and more particularly to a voltage level responsive global reset circuit which is especially suitable for integration into a microprocessor and which is implemented in CMOS technology. Even more specifically, as will be hereinafter, the circuit disclosed herein detects the voltage level of the power supply used to operate the microprocessor during power up. Its trip point is set high to enable initialization procedures carried out at the microprocessor to function before the trip. Reset of this power-up circuit is achieved by bringing the power supply to ground, thereby providing ample noise margin after the trip point is reached. By integrating this circuit into a microprocessor, the states of the various components being reset are known immediately after power up.

BACKGROUND OF THE INVENTION

Intel Corporation, assignee of the present invention, has commercialized a global reset circuit of the general type to which the present invention is directed. This circuit is generally indicated by the reference 10 in FIG. 1 and is more specifically depicted within the dashed box in FIG. 3, that is, excluding the grounded resistor R1 shown outside the dashed box. Referring specifically to FIG. 1 in conjunction with FIG. 2, global reset circuit 10 is shown including an input 12 connected through an on/off switch 14 to a direct current supply voltage Vcc which also serves to power microprocessor 16 and other components 17 and 18, all of which along with circuit 10 are formed on die 19. While the reset circuit is shown separate from microprocessor 10, it could be integrated into the latter. As illustrated in FIG. 2A, the direct current power supply voltage Vcc, when activated by closing switch 14, rises from its minimum voltage level, specifically 0 volts, to a maximum amplitude Vm over a discrete period of time.

Still referring to FIG. 1 in conjuction with FIG. 2, global reset circuit 10 includes an output 20 connected with microprocessor 16 and components 17 and 18 for resetting certain ones of their circuits to specific logic levels when the reset circuit asserts itself by presenting a global reset signal at output 20. As will be described in more detail hereinafter in conjunction with FIG. 3, the global reset circuit includes internal circuitry responsive to the power supply voltage Vcc, as the latter rises from its minimum level, for providing the previously recited global reset signal at output 20 until the power supply voltage reaches a predetermined voltage level, less than its maximum level Vm, depicted as $V_{trip}$, at which time the circuit de-asserts itself, removing the reset signal and allowing the microprocessor 16 and the other components on the die to operate without regard to circuit 10. The voltage level at which the global reset circuit de-asserts itself, for example voltage $V_{trip}$, is selected to be at a substantially higher voltage level than voltage levels required to reliably reset the circuits in question. For example, reliable reset voltage levels might be on the order of 1.5 volts and the reset signal at output 20 of the global reset circuit may not be removed until power supply voltage Vcc reaches 3.0 volts. In that way, de-assertion of the global reset circuit (the point at which the reset signal is removed) is set sufficiently high to enable initialization procedures to take place at the microprocessor and the other components on the die before the reset circuit reaches its trip point.

While global reset circuit 10 operates in a generally satisfactory manner for its intended pupose, it has been found to sometimes respond adversely to brief interruptions in the power supply voltage Vcc, typically interruptions on the order of several seconds or less, after the appropriate circuits have been reset and the reset signal removed from output 20. Specifically, even when a very brief interruption in power supply voltage Vcc occurs at this time, upon the immediate return of the power supply voltage, global reset circuit 10 should function in the manner previously described, that is, to provide the necessary reset signal at output 20 in order to reset the appropriate circuits. However, if the interruption is sufficiently short, circuit 10 has been found not to function. That is, as the power supply voltage Vcc initially rises again, the reset signal should be present but is not and at the point at which the reset signal should be removed, it remains de-asserted. The reason for this will be described immediately below in conjunction with FIG. 3.

Referring briefly to FIG. 3, the previously commercialized reset circuit 10 (located within the dashed box) includes CMOS transistors MP2-MP3-MN3 which, as will be seen hereinafter, serve as a regenerative latching circuit for the overall circuit. More specifically, when the power supply voltage Vcc is initially powered-up, transistor MP1 turns on slowly and continues to do so for maintaining the overall circuit in its asserted state with the reset signal present at output terminal 20. During this time, the latching circuit is maintained in its unlatched state which is accomplished by turning MP2 off, MP3 on, and MN3 off, which results in PWR1 being low and PWR2 being high. When Vcc reaches the selected tripping level in order to remove the reset signal, transistor MP1 is gated off and latches in its off state so long as the power supply voltage remains at its operating level. This ensures the absence of a reset signal at output 20. This also places the latching circuit in its latched on state which is the reverse of the above, that is, MP2 is on, MP3 is off and MN3 is on. This last latched state must be reversed in order for the circuit to be ready for the next Vcc rise. In this case, PWR1 is left to leak off to O v reverse the latched state. This leakage is mainly reverse diode leakage, i.e., very slow. It is important to note that all the charge on PWR1 musk leak away (To O v) before the circuit 10 is ready for the next closure of switch 14. However, in those situations where the interruption is short, the gating voltage of transistor MP3 (the voltage level at PWR1) does not always have a chance to discharge completely. In this regard, it should be kept in mind that the previously commercialized global reset circuit 10 does not include the grounded resistor R1 which, as will be seen, is provided in accordance with the present invention. If indeed the gated voltage transistor MP3 does not have a chance to discharge during the interruption, there will be no reset pulse assertion.

SUMMARY OF THE INVENTION

In view of the foregoing, it is a primary object of the present invention to correct the above-described drawback in the previously commercialized reset circuit 10.

Another, more particular object of the present invention is to correct the above-described drawback in an uncomplicated, reliable and economical manner.

As will be seen hereinafter, the global reset circuit designed in accordance with the present invention may include all of the circuitry making up previously commercialized global reset circuit 10 including, in particular, the regenerative latching circuit comprising MP2-MP3-MN3. It may be recalled, as discussed above, that this latter latching circuit is initially on (PWR1 is at a low voltage) during the period the circuit is asserting itself (during reset) and eventually this latching circuit is off (PWR1 is maintained at a high voltage) in order to trip the overall circuit into its unassertive state and remove the reset signal at its output. In accordance with the present invention, the improved global reset circuit disclosed herein includes means for rapidly directing voltage away from the latching circuit (actually PWR1) sufficient to cause the latching circuit to immediately switch from its off state to its on state in the event that the power supply voltage is interrupted. This assures that the circuit will operate in the intended manner during the next power up after the interruption. In a preferred embodiment, this is accomplished by grounding the transistor MP1 though a predetermined resistance which provides an uncomplicated, reliable and economical solution.

BRIEF DESCRIPTION OF THE DRAWINGS

Circuit 10 and the present invention will be discussed in more detail hereinafter in conjunction with the drawing, wherein:

FIG. 1 is a block diagram of a die or chip containing a microprocessor and other such components having circuitry which must be reset, as well as the previously commercialized global reset circuit 10;

FIG. 2A graphically illustrates the power supply voltage used to power various components on the die illustrated in FIG. 1 including its global reset circuit;

FIG. 2B graphically illustrates voltage profiles at various points within the overall circuit shown in FIG. 3; and FIG. 3 diagrammatically illustrates a global reset circuit designed in accordance with the present invention.

DETAILED DESCRIPTION

In as much as FIGS. 1 and 2 have been described previously, attention is directed immediately to FIG. 3 which, as just stated, diagrammatically illustrates a global reset circuit 22 designed in accordance with the present invention. Circuit 22 is shown including all of the circuitry of previously discussed global reset circuit 10, which circuitry is set within the dashed box, and, in addition, resistor R1 grounded on one side and connected to the drain of transistor MP1 on its opposite side. While the circuitry 10 within the dashed box will be described in more detail hereinafter, for the moment, it suffices to say that this circuitry operates in the manner described previously. Stated briefly here, before power up, that is, before the power supply voltage Vcc is applied to circuitry 10 and the components on die 19, the PWR1 node is initially at zero volts, thereby placing the gate of transistor MP1 at zero volts. When switch 14 (FIG. 1) is closed and power supply voltage Vcc is initially applied to circuitry 10, transistor MP1, which is a weak transistor, gradually turns on. As a result, MP3 turns on (mirror) to charge PWR2 high. As will be seen hereinafter, during this turn-on period, the circuitry is maintained in its assertive state providing a reset signal at its output 20. The circuitry is specifically designed so that when the supply voltage Vcc reaches its tripping level, for example $V_{trip}$ in FIG. 2, the PWR1 node is caused to go high, thereby placing the gates of transistor MP3 and MN3 at a high voltage which latches the latching circuit comprised of MP2-MP3-MN3 in its off state. This, in turn, places the overall circuit in its de-asserted state for as long as the power supply voltage is present. Should there be an intentional or unintentional power-down of supply voltage Vcc, circuitry 22 is designed so that any voltage present at that time at the particular nodes including specifically the node PWR1 have a chance to leak out of the circuitry, given a sufficient amount of time. However, as stated previously, without grounded resistance R1, an interruption on the order of several seconds or less, does not always allow the voltage at node PWR1 to discharge sufficient to unlatch MP2-MP3-MN3. As a result, upon the next power-up circuitry, 22 may not operate properly.

The addition of grounded resistance R1 to circuitry 10 has several advantages. First and of most importance, it allows the latching voltage at the PWR1 node to discharge from the circuit quickly upon power-down, so that, even if a power-down is brief, the overall circuit resets itself in the desired manner. In addition, during power up while the overall circuit remains in its asserted state, the grounded resistance R1 holds the nodes PWR1 to ground in the critical low Vcc regime to prevent any coupling or leakages into the node PWR1 from causing the latching circuit made-up of transistors MP2-MP3-MN3 to latch prematurely, thereby prematurely placing the overall circuit in its de-asserted state. while a single 300K ohm resistor is shown in FIG. 3, it is to be understood that the present invention is not limited to that particular resistance value or, in fact, the utilization of a single discrete resistor. Any suitable means for rapidly directing voltage away the node PWR1 during power-down will suffice.

While overall global reset circuit 22 is specifically depicted including previously commercialized circuitry 10, it is also to be understood that the present invention is not limited to that particular circuitry, so long as the overall global reset circuit functions in the manner describe previously. Moreover, from the specific circuitry illustrated in FIG. 3 and the teachings herein, one with ordinary skill in the art to which the present invention pertains could readily understand the detailed operation of the circuitry. Nevertheless, a more detailed description of the circuitry will be provided immediately below.

Referring specifically to FIG. 3, let it be assumed initially that switch 14 (FIG. 1) is opened and that no power is being supplied to circuit 22 or to the other components on die 19. Under these circumstances, the critical latching node PWR1 is at zero volts (the powered-down state). When power is initially applied by closing switch 14, weak transistors MP1 and MP3 gradually turn on first, forcing the inverter comprised of transistor MP5-MN5 to maintain the PWR3 node at zero V. During this relatively gradual turn on period of transistors MP1 and MP3, the circuitry is designed so that voltage at PWR1 remains sufficiently low so that transistor MP1 remains on while the voltage level at PWR2 is sufficiently high to maintain the transistor MP5 off, thereby maintaining PWR3 at zero volts. This, in turn, results in a DC path through the transistors MP3-MP4-MN2, the latter transistor being on at this time because the node at PWR4 is maintained at a sufficiently high voltage due to the on state of transistor MP4. Because of this DC path MP3-MP4-MN2, the voltage at PWR2 increases at a slower rate than the initial rise in supply voltage Vcc. When the difference between these two voltages becomes large enough, which is predetermined by the circuitry design, the strong transistor MP2 turns on, flipping PWR1 high, thereby latching the latching circuit making up MP2-MP3-MN3 in its powered-up, latched on state. Prior to this point, the overall circuit was in its asserted condition, providing a reset signal at circuit 20. At this point, the latching circuit latches in its latched on state, and rest of the circuitry responds, placing circuit 20 in its de-asserted condition.

As stated previously, the present invention is not limited to the specific circuitry just described. Moreover, though the present has been described as a global reset circuit especially suitable for integration into a microprocessor and implemented in CMOS technology, the present invention is not so limited.

What is claimed is:

1. A reset circuit arrangement comprising:
   (a) reset circuitry having an input for connection with a direct current power supply voltage which, when activated, rises from its minimum voltage level to its maximum voltage level over a period of time, and an output for connection with at least one circuit component to be reset, said circuitry providing a reset signal at said output upon initiation of said power supply voltage and until said power supply voltage reaches a predetermined level, at which time said reset signal is removed;
   (b) a latching circuit which forms part of said reset circuitry and which operates in a first unlatched state in response to and until said power supply voltage reaches said predetermined voltage level for maintaining said reset signal, at which time said latching circuit operates in a second latched state for removing said reset signal, said latching circuit operating in its second, latched state so long as said power supply voltage remains above said predetermined level;
   (c) means also forming part of said reset circuitry for grounding said latching circuit through a predetermined resistance; and
   (d) said latching circuit including a plurality of transistors having a common gate which is grounded through said predetermined resistance so as to rapidly direct voltage away from said common gate of said latching circuit for causing said latching circuit to switch to its first state in the event said power supply voltage is interrupted and for preventing any coupling or leakage of current to said gate from causing said latching circuit to latch prematurely when it is in its unlatched state.

2. A global reset circuit arrangement especially suitable for integration into a microprocessor, said circuit arrangement comprising:
   (a) means defining a circuit input to be connected with a direct current power supply voltage which, when activated, rises from its minimum voltage level to its maximum voltage level over a period of time;
   (b) means defining a circuit output to be integrated into said microprocessor for connection with certain ones of its components to be reset to specific logic levels in response to the presence of a global reset signal at said output;
   (c) global reset circuitry electrically connected between said input and output and responsive to said power supply voltage as the latter, when activated, rises from its minimum level to its maximum level for providing said global reset signal at said output until said power supply voltage reaches a predetermined voltage level above its minimum level, at which time said reset signal is removed, said global reset circuitry including
      (i) a latching circuit which operates in a first state until said power supply voltage reaches said predetermined voltage level, at which time said latching circuit operates in a second state for removing said reset signal,
      (ii) means for latching said latching circuit into said second state at the time said power supply voltage reaches said predetermined voltage level and so long as said power supply voltage remains at or above said predetermined level, whereby to insure the continued absence of said reset signal, and
      (iii) means for grounding said latching circuit through a predetermined resistance so as to rapidly direct voltage away from said latching circuit sufficient to cause said latching circuit to switch to its first state in the event said power supply voltage falls below said predetermined level.

3. A circuit arrangement according to claim 2 wherein said latching circuit includes three transistors.

4. A circuit arrangement according to claim 2 wherein said global reset circuitry is implemented in CMOS technology.

5. A circuit according to claim 2 wherein said predetermined resistance is 300K ohms.

6. A reset circuit arrangement comprising:
   (a) reset circuitry having an input connected with a direct current power supply voltage which, when activated, rises from its minimum voltage level to its maximum voltage level over a period of time, and an output connected with at least one circuit component to be reset, said circuitry providing a reset signal at said ouput upon initiation of said power supply voltage and until said power supply voltage reaches a predetermined level, at which time said reset signal is removed;
   (b) a latching circuit which forms part of said reset circuitry and which operates in a first unlatched state in response to and until as said power supply voltage reaches said predetermined voltage level for maintaining said reset signal, at which time said latching circuit operates in a second latched state for removing said reset signal, said latching circuit operating in its second, latched state so long as said power supply voltage remains above said predetermined level; and
   (c) means also forming part of said reset circuitry for rapidly directing voltage away from said latched latching circuit sufficient to cause said latching circuit to switch to its first state in the event said power supply voltage is interrupted.

7. A circuit arrangement according to claim 6 wherein said last-mentioned means includes means for grounding said latching circuit through a predetermined resistance.

8. A circuit arrangement according to claim 7 wherein said latching circuit includes three transistors, two of which have a common gate and wherein said common gate is grounded through said predetermined resistance.

9. A circuit arrangement according to claim 6 wherein said reset circuitry is implemented in CMOS technology.

* * * * *

UNITED STATES PATENT AND TRADEMARK OFFICE
CERTIFICATE OF CORRECTION

PATENT NO. : 5,111,067
DATED : May 5, 1992
INVENTOR(S) : Keng L. Wong, et al

It is certified that error appears in the above-indentified patent and that said Letters Patent is hereby corrected as shown below:

| | | | |
|---|---|---|---|
| Col. 2, Line 4 | Delete "pupose." | Insert --purpose,-- | |
| Col. 3, Line 4 | After the word "including" | Delete "." | Insert --,-- |
| Col. 4, Line 2 | After the word "level" | Delete "." | Insert --,-- |
| Col. 4, Line 3 | After the word "high" | Delete "." | Insert --,-- |
| Col. 4, Line 6 | After the word "This" | Delete "." | Insert --,-- |
| Col. 4, Line 6 | After the word "turn" | Delete "." | Insert --, -- |
| Col. 4, Line 32 | Delete "while" | Insert --While-- | |
| Col. 5, Line 6 | After the word "high" | Delete "." | Insert --,-- |
| Col. 5, Line9 | After the word "point" | Delete "." | Insert --, -- |
| Col. 5, Line 39 | After the word "second" | Delete "." | Insert --, -- |
| Col. 6, Line 3 | After the word "level" | Delete "." | Insert --, -- |
| Col. 6, Line 4 | After the word "removed" | Delete "." | Insert --, -- |
| Col. 6, Line 8 | After the word "level" | Delete "." | Insert --, -- |

Signed and Sealed this

Twenty-second Day of March, 1994

Attest:

BRUCE LEHMAN

*Attesting Officer*  *Commissioner of Patents and Trademarks*